(12) United States Patent
Dotta et al.

(10) Patent No.: US 7,276,780 B2
(45) Date of Patent: Oct. 2, 2007

(54) SEMICONDUCTOR DEVICE AND CHIP-STACK SEMICONDUCTOR DEVICE

(75) Inventors: Yoshihisa Dotta, Nara (JP); Toshio Kimura, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/455,722

(22) Filed: Jun. 20, 2006

(65) Prior Publication Data

US 2006/0231928 A1 Oct. 19, 2006

Related U.S. Application Data

(62) Division of application No. 10/670,244, filed on Sep. 26, 2003, now Pat. No. 7,115,972.

(30) Foreign Application Priority Data

Oct. 28, 2002 (JP) .............................. 2002-313526

(51) Int. Cl.
*H01L 29/40* (2006.01)
(52) U.S. Cl. ...................... 257/621; 257/698; 257/784
(58) Field of Classification Search ...................... None
See application file for complete search history.

(56) References Cited

U.S. PATENT DOCUMENTS

| 5,132,878 A | 7/1992 | Carey |
| 5,165,166 A | 11/1992 | Carey |
| 5,229,647 A | 7/1993 | Gnadinger |
| 5,426,072 A * | 6/1995 | Finnila ........................ 438/107 |
| 5,438,166 A | 8/1995 | Carey et al. |
| 6,184,060 B1 | 2/2001 | Siniaguine |
| 6,222,276 B1 * | 4/2001 | Bertin et al. ................. 257/778 |
| 6,534,879 B2 | 3/2003 | Terui |
| 6,661,086 B2 * | 12/2003 | Zelsacher .................... 257/687 |
| 6,809,421 B1 | 10/2004 | Hayasaka et al. |
| 2004/0014311 A1 | 1/2005 | Hayasaka et al. |

FOREIGN PATENT DOCUMENTS

| JP | 64-053440 | 3/1989 |
| JP | 06-181389 | 6/1994 |
| JP | 08-008355 | 1/1996 |
| JP | 10-223833 | 8/1998 |
| JP | 2000-031329 | 1/2000 |
| JP | 2001-044357 | 2/2001 |
| JP | 2001-060654 | 3/2001 |
| JP | 3186941 | 5/2001 |
| JP | 2001-250912 | 9/2001 |
| JP | 2002-237468 | 8/2002 |

OTHER PUBLICATIONS

U.S. Appl. No. 10/670,244, filed Sep. 26, 2003.

\* cited by examiner

*Primary Examiner*—Leonardo Andujar
(74) *Attorney, Agent, or Firm*—Nixon & Vanderhye P.C.

(57) ABSTRACT

A semiconductor device has multiple power-supply through electrodes, grounding through electrodes, and signal-routing through electrodes made through a semiconductor chip. The power-supply through electrodes, the grounding through electrodes, and the signal-routing through electrodes differ mutually in cross-sectional area. Hence, a semiconductor device and a chip-stack semiconductor device are provided which are capable of preventing the electrodes' resistance from developing excessive voltage drop, heat, delay, and loss, and also from varying from one electrode to the other.

8 Claims, 13 Drawing Sheets

14: PHOTORESIST
13: INSULATING FILM
12: THERMAL OXIDE FILM (SiO2)
11

OPENING FOR CONNECTED THROUGH ELECTRODE
OPENING FOR NON-CONNECTED THROUGH ELECTRODE

Si

70 μm

SEMICONDUCTOR DEVICE AND CHIP-STACK SEMICONDUCTOR DEVICE

This application is a Divisional of Application Ser. No. 10/670,244, filed Sep. 26, 2003, now U.S. Pat. No. 7,115,972 he entire content of which is hereby incorporated herein by reference in this application.

FIELD OF THE INVENTION

The present invention relates to semiconductor devices including a chip with through electrodes and also to chip-stack semiconductor devices incorporating such semiconductor chips vertically stacked on top of each other, for improved functionality, compactness, and reduced thickness.

BACKGROUND OF THE INVENTION

CSP (Chip Size Package) semiconductor devices have been popularly used to meet the demand for compact electronics and automated manufacturing processes.

FIG. 11 shows the cross-sectional structure of a conventional CSP semiconductor device 100 as an example. The CSP semiconductor device 100 has gold wires 103 extending from electrode pads 102 formed along the periphery of a semiconductor chip 101. Through the gold wires 103, the semiconductor chip 101 is electrically connected to an interposer substrate, or circuit board, 104. The CSP semiconductor device 100 has also external lead electrodes 105 formed on the back of the interposer substrate 104, via which electrodes 105 the interposer substrate 104 is connected to an external device (not shown in the figure).

The wire bonding by means of the gold wires 103 electrically connects the electrode pads 102 on the semiconductor chip 101 to the interposer substrate 104. The gold wires 103 add an extra height to the device 100. They also need be sealed by molding resin 106 for protection. These factors present difficulties in reducing the thickness of the CSP semiconductor device 100.

FCB (Flip Chip Bonding) semiconductor devices like the one shown in FIG. 12(a) and those with through electrodes like the one shown in FIG. 12(b) offer solutions to these problems. These types of CSP semiconductor devices eliminate the need for wires, thereby allowing for thinner devices.

In the FCB semiconductor device 200 in FIG. 12(a), a semiconductor chip 201 is electrically connected to contact pads 205 on an interposer substrate 204 via protrusion electrodes 203 formed on electrode pads 202. The semiconductor chip 201 is positioned so that its surface 206 on which circuitry is formed is opposite to the interposer substrate 204. Sealing resin 207 resides between the surface 206 and the interposer substrate 204 to provide protection to the semiconductor chip 201 and the connecting parts.

In the semiconductor device 210 in FIG. 12(b) where electrical connections are provided by means of through electrodes, protrusion electrodes 215 electrically connect through electrodes 212 formed on a semiconductor chip 211 to contact pads 214 formed on an interposer substrate 213. Sealing resin 216 may be injected for sealing between the semiconductor chip 211 and the interposer substrate 213 if necessary; when this is the case, circuitry is formed on the upper surface 217 of the semiconductor chip 211.

Japanese Published Unexamined Patent Application 10-223833 (Tokukaihei 10-223833/1998; published on Aug. 21, 1998), Japanese Patent 3186941 (issued on May 11, 2001), U.S. Pat. No. 6,184,060 (Date of patent: Feb. 6, 2001), and other recent documents disclose proposed multi-chip semiconductor devices in which the foregoing semiconductor device includes film carrier semiconductor modules which are stacked vertically on top of each other and connected electrically for greater packaging efficiency.

Referring to FIG. 13, a multi-chip semiconductor device 300 described in Tokukaihei 10-223833/1998 includes three chips 301a, 301b, 301c stacked sequentially upwards from bottom. Each chip 301a, 301b, 301c is principally made up of a silicon substrate 302 carrying integrated devices; wiring layers 303 connecting the integrated devices in a predetermined pattern; through electrodes (connection plugs) 306 provided inside through holes 305 extending through the silicon substrate 302 and an interlayer insulating film 304 for the wiring layers 303 to electrically connect the chips 301a, 301b to the chips 301b, 301c; and an opening insulating film 307. The through electrodes 306 provide external connection terminals for grounding and power and various signal supplies, and are formed in accordance with uses for each chip 301a, 301b, 301c. The back of the silicon substrate 302, except for the openings for the through electrodes 306, is covered with a back insulating film 308.

Through the wiring layers 303 on the chip 301a, 301b, 301c are there provided electrode pads 309 electrically connected to the metal plugs 306. The through electrode 306 for the chip 301a is connected to the through electrode 306 for the chip 301b via an electrode pad 309 and a solder bump 310; meanwhile, the through electrode 306 for the chip 301b is connected to the through electrode 306 for the semiconductor device 301c via another electrode pad 309 and another solder bump 310.

Thus, the chips 301a, 301b, 301c are electrically connected with each other, offering a chip-stack semiconductor device.

In the conventional chip-stack semiconductor device, the terminal for the same signal is disposed at the same position on every chip, to provide electrical connections between the vertically stacked chips.

However, in the conventional chip-stack semiconductor device with through electrodes, all the through electrodes have equal cross-sectional areas of which the value is determined disregarding the functions of the through electrodes: e.g., the ground and power supply terminals have equal cross-sectional areas to those of the signal terminals despite the former conducting greater electric current than the latter. This raises problems that those terminals which need pass great electric current may heat up, delay signals, or develop other undesirable phenomena.

Further, in stacking chips with through electrodes, a chip adds an extra length to the through electrode connecting the top and the bottom chips. The extra length of the electrode translates into an extra resistance, resulting in voltage drop, heating, delay, and loss.

Further, the through electrodes vary greatly in interconnect line length, hence in resistance.

SUMMARY OF THE INVENTION

The present invention has an objective to offer a semiconductor device and a chip-stack semiconductor device which are capable of preventing the electrodes' resistance from developing excessive voltage drop, heat, delay, and loss and also from varying from one electrode to the other.

In order to achieve the objective, a semiconductor device in accordance with the present invention includes multiple through electrodes in a semiconductor chip linking a front surface to a back surface thereof, wherein the through electrodes have mutually differing cross-sectional areas.

According to the invention, the multiple through electrodes have mutually differing cross-sectional areas; increasing the cross-sectional areas of the through electrodes for terminals required to conduct large electric current reduces the resistance of the through electrodes and alleviates heating, signal delay, etc.

Therefore, a semiconductor device can be provided which is capable of preventing the resistance of the through electrodes from developing excessive voltage drop, heat, delay, and loss, and also from varying from one electrode to the other.

A chip-stack semiconductor device in accordance with the present invention includes a plurality of such semiconductor chips being stacked.

According to the invention, the above-described semiconductor chips are stacked on top of each other. The area of the through electrodes required to make interconnects over an extended length can be increased in accordance with that length. This reduces the resistance of the electrodes and alleviates voltage drop, heat, delay, and loss. Variations in resistance between terminals can also be reduced.

In addition, designating some of the through electrodes as non-contact through electrodes not electrically connected to the semiconductor chips allows a current to flow all the way from the top chip to the bottom chip.

Additional objects, advantages and novel features of the invention will be set forth in part in the description which follows, and in part will become apparent to those skilled in the art upon examination of the following or may be learned by practice of the invention.

DESCRIPTION OF THE EMBODIMENTS

Embodiment 1

Referring to FIG. 1 through FIG. 8, the following will describe an embodiment according to the present invention.

Figure 1:
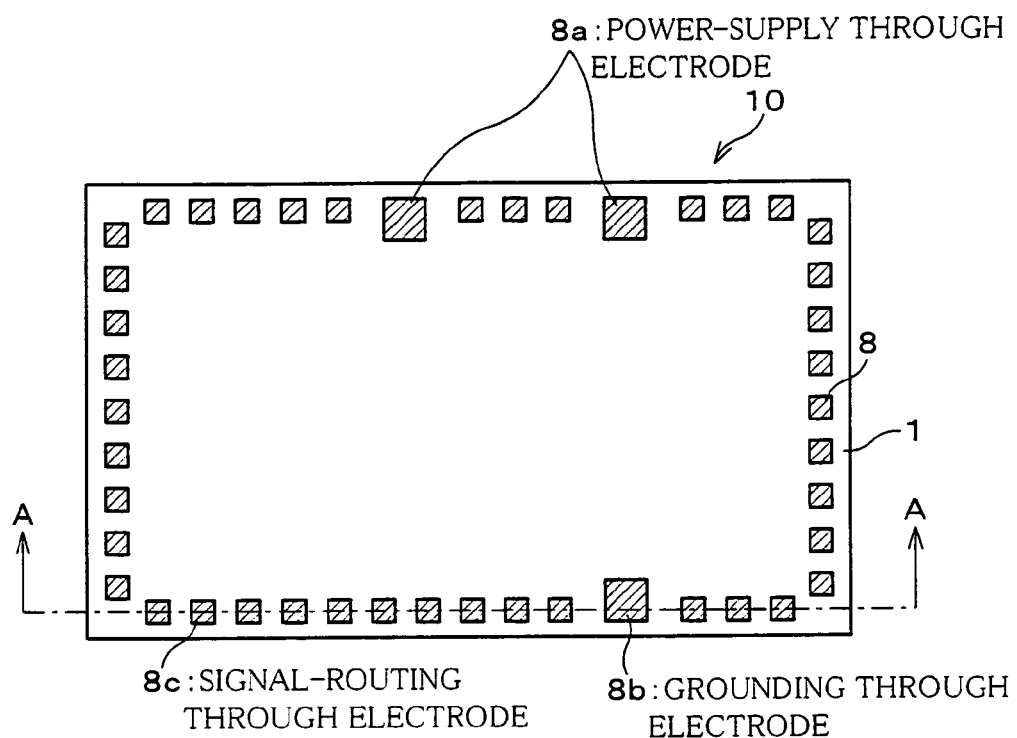
FIG. 1(*a*) is a plan view illustrating an embodiment of a semiconductor device according to the present invention, and FIG. 1(*b*) is a cross-sectional view of the semiconductor device along line A-A.
Figure 1:
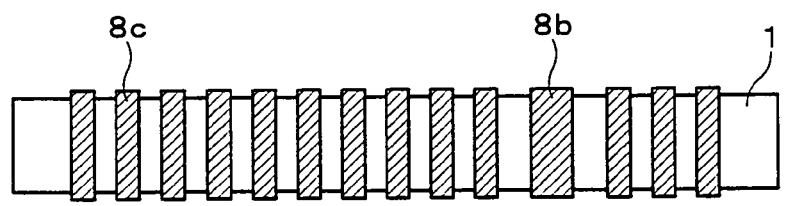

FIG. 1(*a*) is a plan view illustrating a semiconductor device 10 in the present embodiment. A semiconductor chip 1 in the semiconductor device 10 has along its periphery multiple through electrodes 8 having differing cross-sectional areas. The through electrodes 8 are made through the semiconductor chip 1.

As shown in FIGS. 1(*a*), 1(*b*), the through electrodes 8 are divided into three major types: power-supply through electrodes 8*a*, grounding through electrodes 8*b*, and signal-routing through electrodes 8*c*. The power-supply through electrode 8*a* and the grounding through electrode 8*b* have a different cross-sectional area from that of the signal-routing through electrode 8*c*. More specifically, the power-supply through electrode 8*a* and the grounding through electrode 8*b* have a greater cross-sectional area than the signal-routing through electrode 8*c*.

Reasons follow: the power-supply through electrode 8*a* and the grounding through electrode 8*b* conduct current of a greater value than does the signal-routing through electrode 8*c*; therefore, the power-supply through electrode 8*a* and the grounding through electrode 8*b* conducting electric current of a greater value are formed with a greater cross-sectional area than the signal-routing through electrode 8*c* conducting electric current of a smaller value. In the above example, the power-supply through electrode 8*a* is presumed to have an equal cross-sectional area to the grounding through electrode 8*b*. Alternatively, the power-supply through electrode 8*a*, the grounding through electrode 8*b*, and the signal-routing through electrode 8*c* may have a cross-sectional area which increases with an increase in the electric current passing through them. Further, in the example, the through electrode 8 is presumed to be rectangle. Alternatively, it may be circular or take another shape.

Increasing the area of the through electrode 8 for the terminal required to conduct greater electric current as discussed in the foregoing lowers the resistance of the through electrode 8 and alleviates heating, signal delay, etc.

Figure 2:
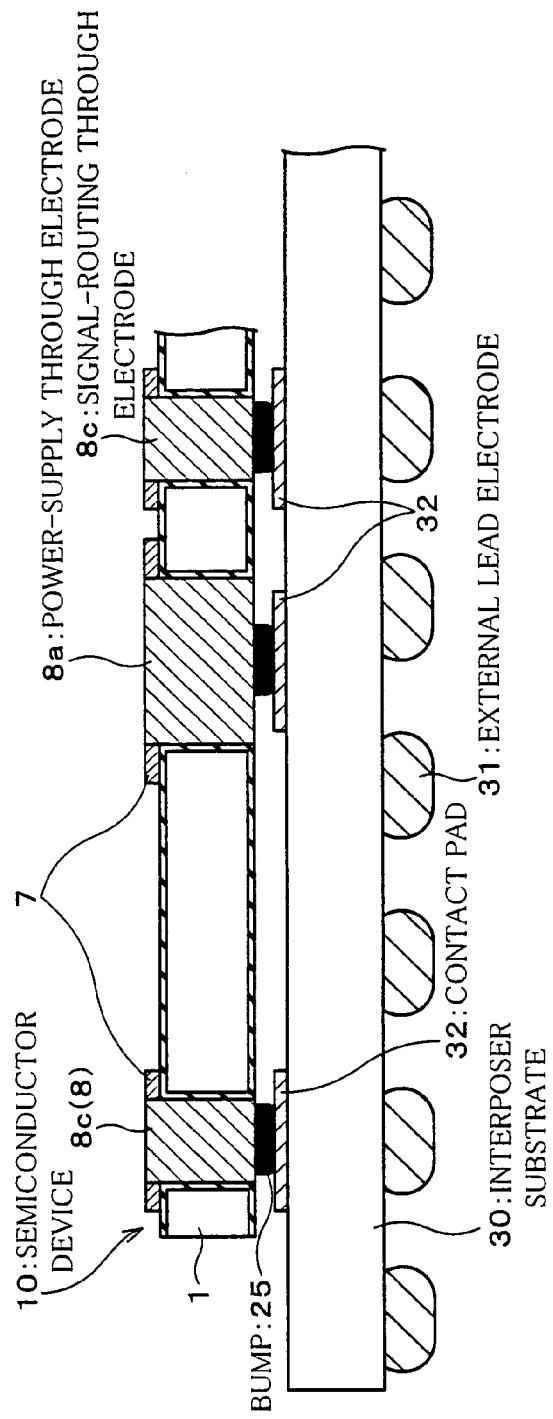
FIG. 2 is a cross-sectional view illustrating a semiconductor device mounted on an interposer substrate.

In the semiconductor device 10, as shown in FIG. 2, an interconnect pattern extends from a device region (not shown in the figure) on the semiconductor chip 1 and connects to the through electrodes 8 at electrode pads 7. More specifically, in the semiconductor chip 1, numerous fine lines (not shown in the figure) extend from the device region as an interconnect pattern. The electrode pad 7 refers to the relatively large electrode terminal disposed on the tip of an interconnect pattern along the periphery of the semiconductor chip 1 to provide an external electrical input/output to the interconnect pattern. Conventionally, wire bonds are provided on the electrode pads 7.

The through electrode 8 is electrically connected to an external lead electrode 31 on the back of the interposer substrate 30. More specifically, external lead electrodes 31 are formed on the back of the interposer substrate 30. The external lead electrodes 31 are electrically connected to contact pads 32 on the front surface in via holes (not shown in the figure) made through the interposer substrate 30. The contact pads 32 are provided at the same surface positions as the through electrodes 8 in the semiconductor device 10. Connecting the contact pads 32 to the through electrodes 8 (the power-supply through electrodes 8a, the signal-routing through electrodes 8c, etc.) with intervening bumps 25 establishes electrical connections between the through electrodes 8 in the semiconductor device 10 and the bare contact pads 32 on the back of the interposer substrate 30. Thus, the device region on the semiconductor chip 1 is electrically connected to the external lead electrodes 31 which can be further connected to, for example, a power supply for a printed circuit board (not shown in the figure).

It is presumed in the above description that the through electrode 8 in the semiconductor device 10 is connected to the interposer substrate 30 beneath it via the bump 25; alternatively, for example, wires may be connected to the front surface of the through electrodes 8.

In the present embodiment, the interposer substrate 30 is used as a relay between the semiconductor device 10 and a circuit board (not shown in the figure). The pitch of the electrode pads 7 on the semiconductor device 10 is small, and does not match that of the electrodes on a circuit board or a mother board. The interposer substrate 30 acts to convert the pitch. In addition to the pitch conversion for the electrode pads 7 on the semiconductor device 10, the interposer substrate 30 plays another role in, for example, alleviating stress between the semiconductor device 10 and the circuit board (not shown in the figure).

Reducing the chip size of the semiconductor device 10 to a minimum is an important cost-cutting factor; therefore, normally, the through electrodes 8 are preferably as small as possible.

In the present embodiment, the signal-routing through electrode 8c measures 10 µm on each side, and the semiconductor device 10 is made as thin as 50 µm, to achieve compactness and slimness. The original semiconductor wafer 11 (detailed later) is about 600-700 µm in thickness. It is polished down generally to a thickness of about 300-400 µm and for some recent CSP (chip size package) and other applications, to a thickness of about 150-200 µm.

However, the power supply terminal and the ground terminal must conduct relatively large electric current when compared to the signal terminal. It is therefore preferred if the former have as low line resistance as possible; otherwise, they may cause excessive voltage drop, heat, signal delay, etc. Consequently, it is preferred if either the power-supply through electrode 8a or the grounding through electrode 8b, connected respectively to the power supply terminal and the ground terminal, has an increased cross-sectional area of twice to five times that of the signal-routing through electrode 8c connected to the signal terminal.

In the present embodiment, to lower the resistance of the power supply and ground terminals, the power-supply through electrode 8a and the grounding through electrode 8b, connected respectively to the power supply terminal and the ground terminal, are designed to have a cross-sectional area measuring 20 µm on each side, which is greater than the cross-sectional area of the signal terminal.

The design lowers the line resistance of the power supply and ground terminals conducting large electric current, hence alleviating heating and signal delay.

Figure 3:
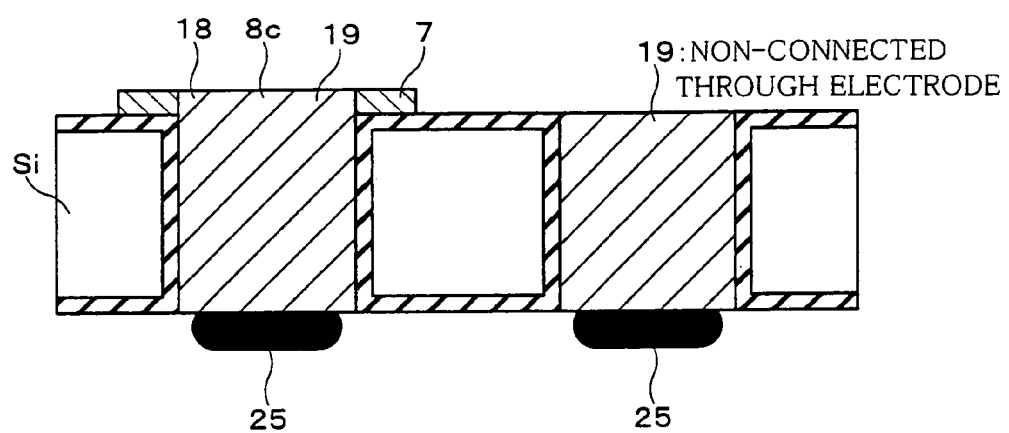
FIG. 3 is a cross-sectional view illustrating a semiconductor device with both a contact electrode and a non-contact through electrode.
Figure 4:
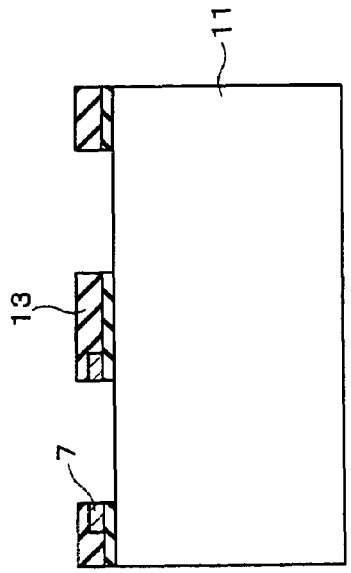
FIGS. 4(*a*)-4(*d*) are cross-sectional views illustrating manufacturing steps for the through electrodes in the semiconductor device.
Figure 4:
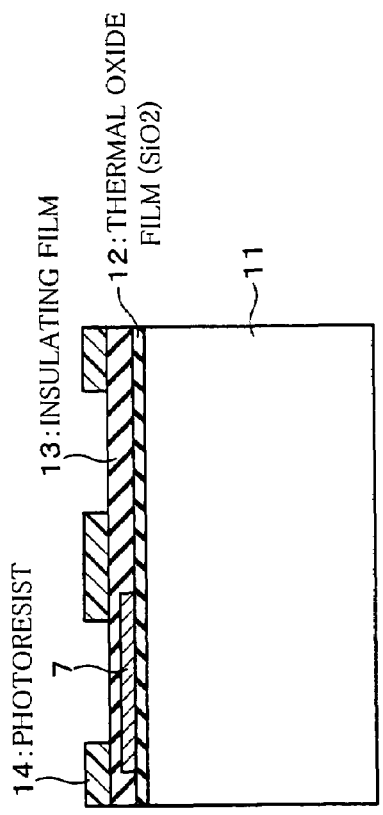
Figure 4:
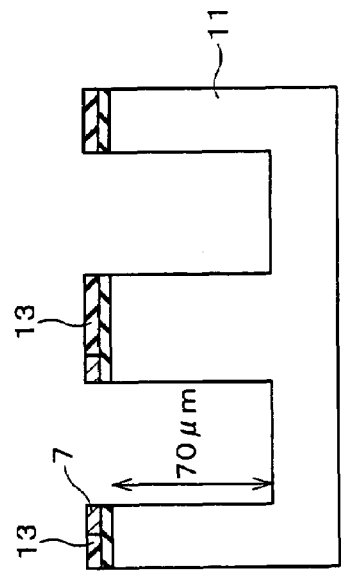
Figure 4:
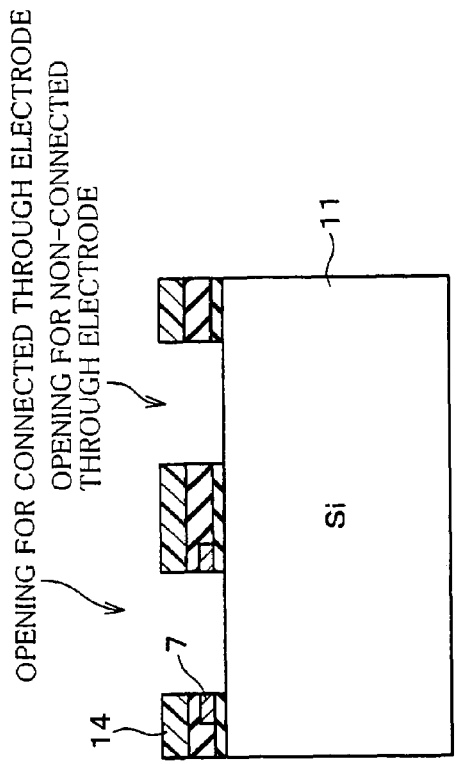
Figure 5:
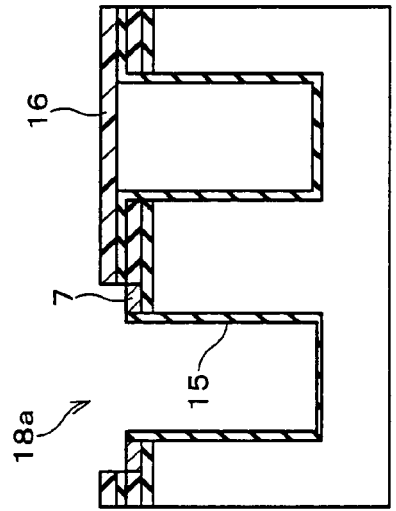
FIGS. 5(*a*)-5(*d*) are cross-sectional views illustrating manufacturing steps for the through electrodes in the semiconductor device, subsequent to the step in FIG. 4(*d*).
Figure 5:
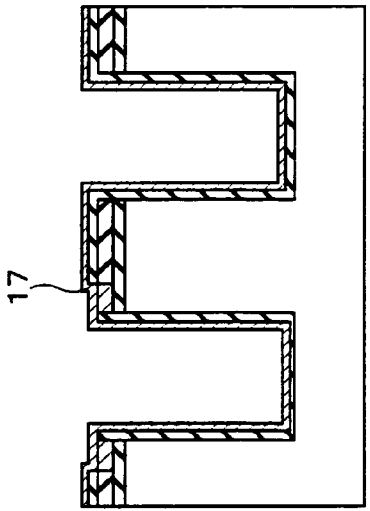
Figure 5:
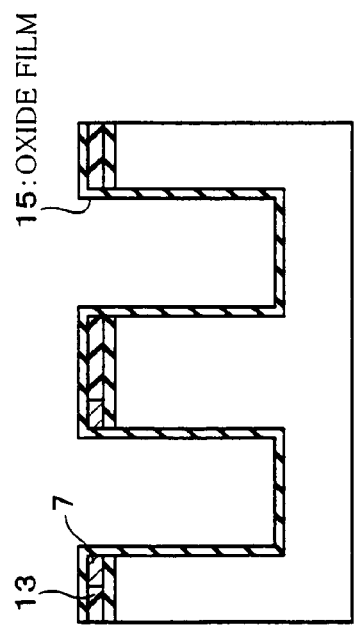
Figure 5:
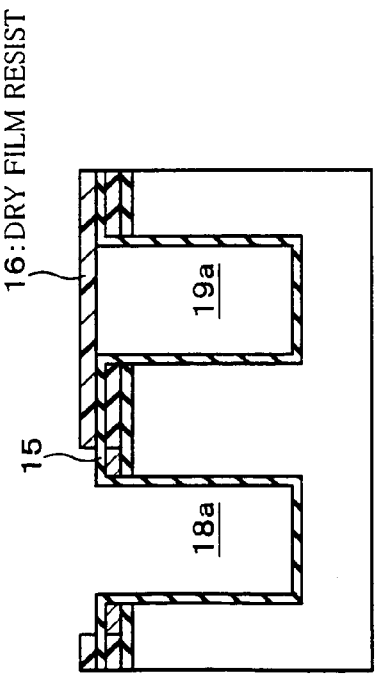
Figure 6:
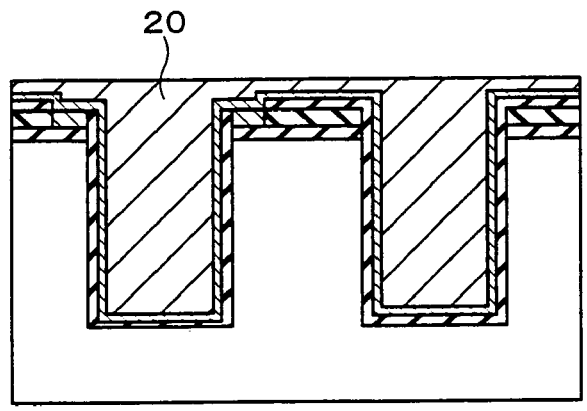
FIGS. 6(*a*)-6(*c*) are cross-sectional views illustrating manufacturing steps for the through electrodes in the semiconductor device, subsequent to the step in FIG. 5(*d*).
Figure 6:
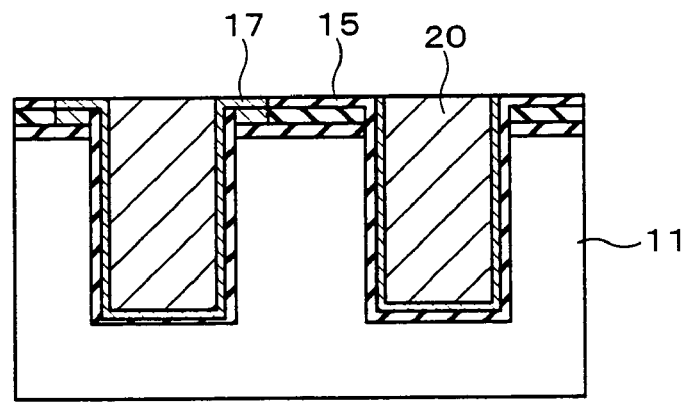
Figure 6:
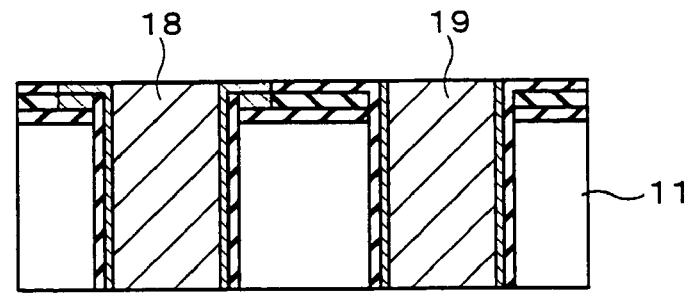
Figure 7:
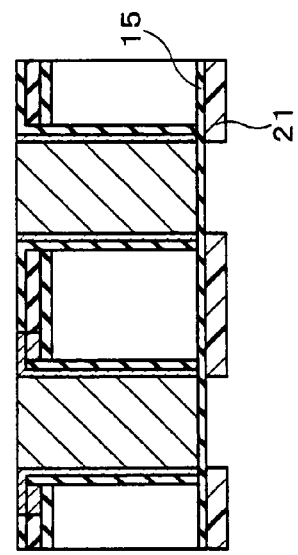
FIGS. 7(*a*)-7(*e*) are cross-sectional views illustrating manufacturing steps for the through electrodes in the semiconductor device, subsequent to the step in FIG. 6(*c*).
Figure 7:
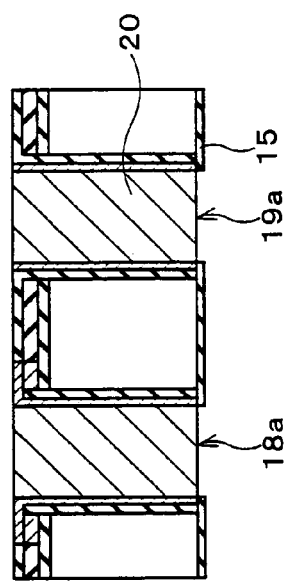
Figure 7:
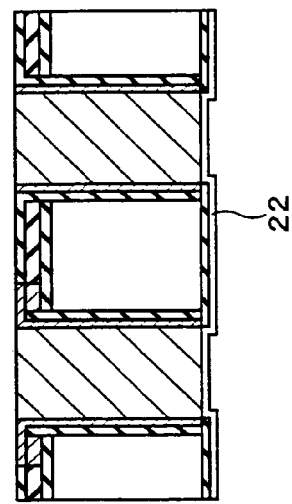
Figure 7:
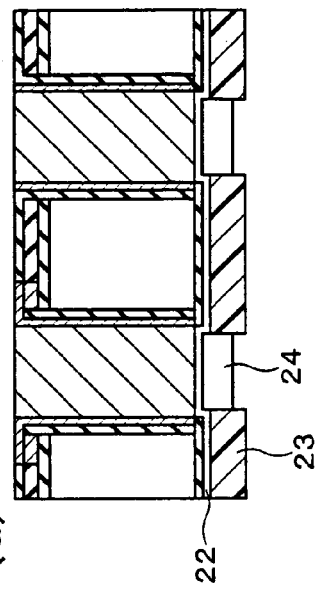
Figure 7:
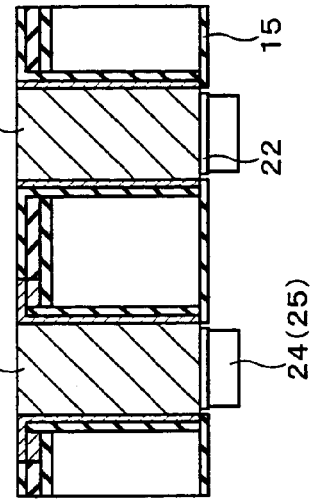

The foregoing description presumes that the through electrodes 8 are all connected to the electrode pads 7 on the semiconductor chip 1; an alternative example is shown in FIG. 3 where some of the through electrodes 8 are connected to the electrode pads 7 on the semiconductor chip 1 and redesignated as contact through electrodes 18, and the rest is not connected to the electrode pads 7 and redesignated as non-contact through electrodes 19.

The formation of the non-contact through electrodes 19 in the semiconductor device 10 as in the foregoing is advantageous in that the non-contact through electrodes 19 provides heat generated in the semiconductor device 10 exit paths to the interposer substrate 30 or another substrate. Other uses of the non-contact through electrodes 19 will be detailed later in embodiment 2.

Now, referring to FIG. 4 through FIG. 7, a manufacturing method will be described for the semiconductor device 10 with the contact through electrodes 18 and the non-contact through electrodes 19. The description will mainly focus on the formation method of the through electrodes 8.

First, refer to FIG. 4(a) showing the cross-sectional structure of the silicon (Si) semiconductor wafer 11 near the electrode pads 7.

In FIG. 4(a), a silicon dioxide ($SiO_2$) thermal oxide film 12 is formed on the surface of the silicon (Si) semiconductor wafer 11. On the film 12 are formed the electrode pads 7 made of a metal, primarily aluminum (Al) for example. Further, the surface of the thermal oxide film 12 and the electrode pads 7 are protected with a silicon dioxide ($SiO_2$) insulating film (oxide film) 13. The surface insulating film 13 is, for example, 0.7 µm thick on the electrode pads 7.

Apply a photoresist 14 to the semiconductor wafer 11 with openings where the through electrodes 8 will be formed. The size of these openings in the photoresist 14 will be equal to that of the through electrodes 8. Attention should be paid where necessary: e.g., some openings must be large in size to accommodate terminals conducting large electric current, those provided for extended length interconnects, and others which are required to have low resistance. In the related figures here, all the openings are drawn in the same size for the purpose of illustrating an example of how the through electrodes 8 are formed.

Moving on to FIG. 4(b), the insulating film 13, the electrode pads 7, and the thermal oxide film 12 the surface are removed by dry etching, using the photoresist 14 as a mask. The silicon (Si) for the semiconductor wafer 11 is now exposed.

Next, referring to FIG. 4(c), the photoresist 14 is removed, and the silicon (Si) for the semiconductor wafer 11 is dry etched to a predetermined depth using the insulating film 13 as a mask. In the present embodiment, the silicon was etched down to, for example, a depth of 70 µm. In the etching step, the insulating film 13 used as a mask is also etched.

The dry etching machine we used had a silicon dioxide ($SiO_2$) versus silicon (Si) selectivity of about 1:100; the electrode pads 7 become exposed by specifying the insulating film 13 to have a 0.7-µm thickness on the electrode pads 7 and etching the silicon (Si) for the semiconductor wafer 11 down by 70 µm. By hence adjusting the thickness of the insulating film 13 used as a mask by means of the selectivity and etching the silicon (Si) for the semiconductor wafer 11 to a desired depth, the electrode pads 7 can become exposed.

Moving to FIG. 5(a), an oxide film 15 is formed on the inside walls of the holes and on the surface of the electrode pads 7 and the insulating film 13. The oxide film 15 is formed in this manner to provide insulation to the silicon (Si) when conductive bodies are formed in the holes in a later step. In the present embodiment, to form the oxide film 15 on the inside walls of the deep holes, a TEOS (tetraethylorthosilicate) oxide film is formed by CVD (Chemical Vapor Deposition). This time, the oxide film 15 was formed with a thickness of, for example, about 1 µm on the inside walls. The TEOS oxide film refers to the oxide film formed on silicon (Si) using TEOS which is a liquid source used in CVD of silicon dioxide (SiO$_2$).

Next, as shown in FIG. 5(b), those parts 19a where the non-contact through electrodes 19 will be formed are covered with a dry film resist 16. In that state, the oxide film 15 is dry etched by RIE (Reactive Ion Etching) as shown in FIG. 5(c). Dry etching is anisotropic, and the inside walls of the holes are hardly etched. Only the oxide film 15 on the surface is etched, so that those electrode pads 7 become exposed which are found in those parts 18a where the contact through electrodes 19 will be formed.

The dry film resist 16 is not a liquid photoresist, but refers to a photoresist film in which a resist material is sandwiched between a polyester cover sheet and a polyethylene separator sheet. The separator sheet is peeled, and the rest is attached (laminated) to an object and exposed to light. After the exposure, the cover sheet is peeled, and the remaining part is developed.

RIE is an etch step whereby gas is made into a plasma state by an electric or magnetic field in a chamber (chemical reaction chamber) and a directional reactive ion species is used. Sputtering which progresses simultaneously with chemical reactions facilitates the formation of vertical cross-sectional shapes free from sideways etching, and is suitable for fine pattern fabrication.

Referring now to FIG. 5(d), a seed layer 17 for electroplating implemented in a later step is formed over the entire surface of the wafer. In the present embodiment, the seed layer 17 includes two layers, TiN/Cu, both formed by sputtering. The seed layer 17 refers in the example above to the TiN/Cu current-feeding metal for electroplating use. Plating grows when the current-feeding metal feeds electricity.

Referring now to FIG. 6(a), copper 20 is electroplated to fill in the holes.

Referring now to FIG. 6(b), the electroplated copper 20 and the TiN/Cu forming the seed layer 17 are removed from the wafer surface by CMP.

Referring now to FIG. 6(c), the silicon (Si) on the back of the semiconductor wafer 11 is ground to reduce its thickness to a desired level. In the present embodiment, the silicon was ground down to a 50-1 µm thickness across the whole wafer. The grinding exposes the electroplated copper 20 which will be fabricated into the contact through electrodes 18 and the non-contact through electrodes 19. After the grinding of the back of the semiconductor wafer 11, if necessary, the silicon (Si) may be etched using a chemical solution or plasma to smooth the ground surface.

To protect the semiconductor wafer 11 during the grinding of the back of the semiconductor wafer 11, a support board made of, for example, quartz glass may be attached to the surface of the semiconductor wafer 11 opposite to the wafer using an adhesive agent and removed after implementation of all steps.

Next, a process will described which forms protrusion electrodes on the back of the wafer.

Referring to FIG. 7(a), an oxide film 15 is formed over the entire back surface of the wafer by CVD. After the application of the photoresist 21, as shown in FIG. 7(b), those parts 18a and 19a are opened where the contact through electrodes 18 and the non-contact through electrodes 19 will be formed respectively. Then, using the photoresist 21 as a mask, the oxide film 15 is removed from the back of the semiconductor wafer 11 by dry etching to expose the electroplated copper 20, i.e., the contact through electrodes 18 and the non-contact through electrodes 19. Thereafter, the photoresist 21 is removed. Referring now to FIG. 7(c), TiW/Cu are provided on the back of the wafer by sputtering, as a seed metal 22 for use in the formation of bumps by plating. Referring now to FIG. 7(a), with areas exposed where bumps will be formed by plating, a photoresist layer 23 is formed, and gold 24 is electroplated. Referring now to FIG. 7(e), the photoresist layer 23 is removed, and the seed metal 22 removed by etching using the electroplated gold 24 as a mask, to obtain a semiconductor device 10 provided with the contact through electrodes 18 and the non-contact through electrodes 19 complete with the electroplated gold 24 as bumps 25.

The etching of the seed metal 22 is done as follows. First, the copper (Cu) is etched using, for example, Alkaetching Solution (product name) available from Yamato-ya Shoukai or a mixed solution of hydrochloric acid and ferric chloride, and then the TiW is etched using, for example, an aqueous solution of peroxide hydrogen or a mixed solution of an aqueous solution of peroxide hydrogen, ammonia water, and EDTA.

Figure 8:
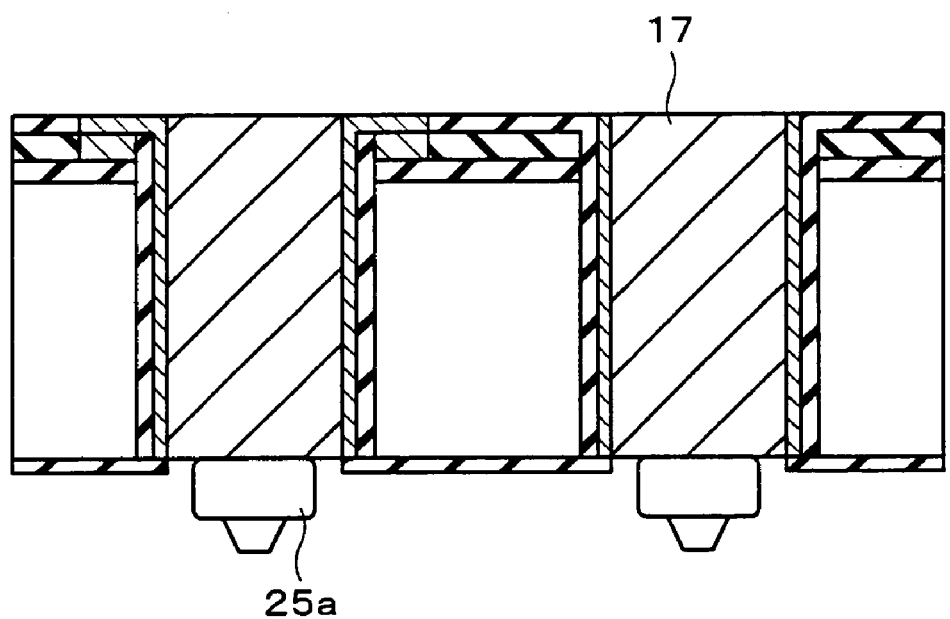
FIG. 8 is a cross-sectional view illustrating a semiconductor device with wire bumps being formed on the through electrodes.

Apart from these methods, various methods are suggested as to the formation of the bumps 25, the contact through electrodes 18, and the non-contact through electrodes 19. These members are not necessarily formed by the methods described in the present embodiment. For example, as shown in FIG. 8, the bumps 25 on the back of the wafer may be formed by wiring (wire bumps 25a), rather than by plating. The wire bumps 25a are formed on the electroplated copper 20 after the step shown in FIG. 7(b).

For the semiconductor device 10 in the present embodiment, the through electrodes 8 are not necessarily formed by the previous method; alternatively, for example, those methods can be applied which are described in Japanese Patent 3186941, Japanese Published Unexamined Patent Application 10-223833 (Tokukaihei 10-223833/1998), and U.S. Pat. No. 6,184,060.

The method described in Japanese Patent 3186941 forms openings for the through electrodes from the back side of the silicon (Si) substrate. According to the method, the through electrodes 8 can be made with differing cross-sectional areas by changing the size of the openings in the photoresist on the back of the silicon (Si) substrate.

According to the method described in Japanese Published Unexamined Patent Application 10-223833 (Tokukaihei 10-223833/1998), the through electrodes 8 can be made with differing cross-sectional areas by changing the size of the openings in the silicon dioxide (SiO$_2$) mask pattern.

According to the method described in U.S. Pat. No. 6,184,060, the through electrodes 8 can be made with differing cross-sectional areas by changing the size of the openings in the aluminum (Al) mask.

As in the foregoing, in the semiconductor device 10 in the present embodiment, the through electrodes 8 have mutually differing cross-sectional areas. Increasing the cross-sectional areas for those through electrodes 8 for the terminals required to conduct large electric current reduces the resistance of the through electrodes 8, and alleviates heating, delay, etc.

Hence, the semiconductor device 10 can be provided which is capable of preventing the electrodes' resistance from developing excessive voltage drop, heat, delay, and loss, and also from varying from one electrode to the other.

In addition, in the semiconductor device 10 in the present embodiment, increasing the cross-sectional areas for those contact through electrodes 18, electrically connected to the device region via the electrode pads 7 on the semiconductor chip 1, for the terminals required to conduct large electric current helps efficient operation of the semiconductor chip 1.

In addition, in the semiconductor device in the present embodiment, at least one type of the through electrodes 8 is the non-contact through electrodes 19 which are not electrically connected to the device region via the electrode pads 7 on the semiconductor chip 1.

Therefore, the heat generated in the semiconductor device 10 can be discharged outside via the non-contact through electrodes 19.

In addition, in the semiconductor device 10 in the present embodiment, the cross-sectional areas of the through electrodes 8 are increased according to the value of the electric current passing through the through electrodes 8; therefore, increasing the cross-sectional areas for those through electrodes 8 for the terminals required to conduct large electric current reduces the resistance of the through electrodes 8, and alleviates heating, delay, etc. Variations in resistance between terminals can also be reduced.

The ground and power supply terminals of the semiconductor chip 1 conduct relatively large electric current when compared to the signal terminal.

As to this point, in the present embodiment, the power-supply through electrode 8a connected to either the ground or power supply terminal of the semiconductor chip 1 is formed with a greater cross-sectional area than the signal-routing through electrode 8c connected to the signal terminal.

Therefore, increasing the cross-sectional areas for the power-supply through electrodes 8a for the ground terminals or power supply terminals of the semiconductor chip 1 required to conduct large electric current reduces the resistance of the power-supply through electrodes 8a, and alleviates heating, delay, etc. Variations in resistance between terminals can also be reduced.

Embodiment 2

Figure 9:
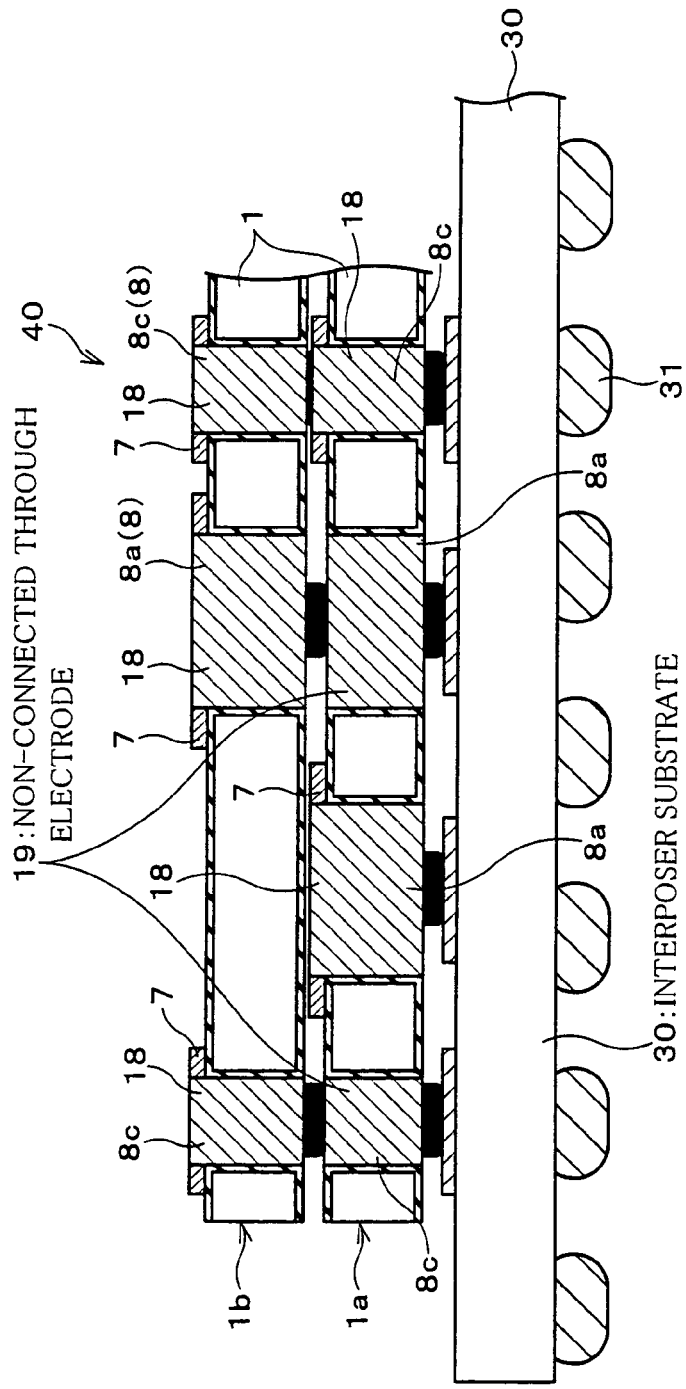
FIG. 9 is a cross-sectional view illustrating an embodiment of a chip-stack semiconductor device in accordance with the present invention.

The following will describe another embodiment of the present invention with reference to FIG. 9. For convenience, members of the present embodiment that have the same arrangement and function as members of embodiment 1, and that are mentioned in that embodiment are indicated by the same reference numerals and description thereof is omitted.

The present embodiment will describe a chip-stack semiconductor device which includes multiple in general and two in particular stacked semiconductor chips of the semiconductor device 10 of embodiment 1.

Referring to FIG. 9, the chip-stack semiconductor device 40 of the present embodiment includes an interposer substrate 30 on which are sequentially stacked two semiconductor chips 1: a semiconductor chip 1a and a semiconductor chip 1b. In an example of this kind of chip-stack semiconductor device 40, the semiconductor chip 1a is a logic memory, and the semiconductor chip 1b is a flash memory.

In the chip-stack semiconductor device 40 thus arranged are there provided through electrodes 8 along the periphery of the semiconductor chips 1a, 1b. FIG. 3 only shows the structure of the periphery of the semiconductor chips 1a, 1b and the interposer substrate 30.

Of the through electrodes 8, for example, signal-routing through electrodes 8c are provided along the periphery of the semiconductor chips 1a, 1b at the same surface positions. Power-supply through electrodes 8a are provided along the periphery of the lower semiconductor chip 1a, but somewhat inside the signal-routing through electrodes 8c.

Further inside the power-supply through electrodes 8a at the same surface positions on the semiconductor chips 1a, 1b are there provided, for example, power-supply through electrodes 8a. Further inside the power-supply through electrodes 8a are there provided, for example, signal-routing through electrodes 8c at the same surface positions on the semiconductor chips 1a, 1b.

According to the arrangement of the chip-stack semiconductor device 40, on the upper semiconductor chip 1b, there are provided electrode pads 7 made of a metal, primarily aluminum (Al) for the signal-routing through electrodes 8c, the power-supply through electrodes 8a, and the signal-routing through electrodes 8c which are arranged in this order from the periphery of the chip 1b. Electrode pads 7 made of a metal, primarily aluminum (Al) are also formed for the second left power-supply through electrode 8a and the fourth left signal-routing through electrode 8c in the figure on the lower semiconductor chip 1a.

In contrast, no electrode pads 7 are formed for the leftmost signal-routing through electrode 8c or the third left power-supply through electrode 8a on the lower semiconductor chip 1a, which are present simply to connect the through electrodes 8 in the upper layer to the interposer substrate 30. In the present embodiment, those through electrodes 8 which are disposed merely to connect the through electrodes 8 in the upper layer to the interposer substrate 30 are referred to as the non-contact through electrodes 18. More specifically, the non-contact through electrode 18 is a kind of through electrode 8 made through the semiconductor chip 10; it is not electrically connected to the semiconductor chip 1 via electrode pads 7, but provides an insulated electrical path through the semiconductor chip 1.

In contrast, electrode pads 7 made of a metal, primarily aluminum (Al) are formed for the signal-routing through electrode 8c, the power-supply through electrode 8a, and the signal-routing through electrode 8c on the upper semiconductor chip 1b, as well as the second left power-supply through electrode 8a and the fourth left signal-routing through electrode 8c on the lower semiconductor chip 1a. Through the electrode pads 7, these electrodes are all connected to the semiconductor chip 1 and therefore referred to as the contact through electrodes 19.

In the chip-stack semiconductor device 40, the signal-routing through electrode 8c connected to the electrode pad 7 on the upper semiconductor chip 1b is connected via the signal-routing through electrode 8c to the lower semiconductor chip 1a and the external lead electrode 31 on the interposer substrate 30.

The power-supply through electrode 8a connected to the electrode pad 7 on the upper semiconductor chip 1b is electrically connected to the non-contact through electrode 19 on the lower semiconductor chip 1a and further to the interposer substrate 30. The electrode 8a is further connected to the external lead electrode 31.

The rightmost signal-routing through electrode 8c connected to the electrode pad 7 on the upper semiconductor chip 1b is electrically connected to the contact through electrode 18 on the lower semiconductor chip 1a and further to the interposer substrate 30. The electrode 8c is further connected to the external lead electrode 31. As discussed in the foregoing, when the electrodes through the upper semiconductor chip 1b and those through the lower semiconductor chip 1a conduct the same signals, this configuration can be taken.

The power-supply through electrode 8a, which is the second left through electrode 8, connected to the electrode pad 7 on the lower semiconductor chip 1a is connected to the interposer substrate 30 and further to the external lead electrode 31. When adjacent semiconductor chips 1 are connected or the semiconductor chip 1a is connected to a substrate such as the interposer substrate 30, this configuration is taken. Although not shown in the figure, a similar configuration is taken when the through electrodes 8 on the upper semiconductor chip 1b are connected only to the lower semiconductor chip 1a.

Reducing the size of the semiconductor chips 1a, 1b in the chip-stack semiconductor device 40 to a minimum is an important cost-cutting factor; therefore, normally, the power-supply through electrodes 8a and the non-contact through electrodes 19 are preferably as small as possible in the present embodiment, the power-supply through electrode 8a and the non-contact through electrode 19 measure 10 µm on each side, and the semiconductor chips 1a, 1b are as thin as 50 µm, to achieve compactness and slimness.

However, the power supply terminal and the ground terminal must conduct relatively large electric current when compared to the signal terminal. It is therefore preferred if the former have as low line resistance as possible; otherwise, they may cause excessive voltage drop, heat, signal delay, etc. Consequently, it is preferred if the through electrode 8 connected to both the power supply terminal and the ground terminal has a cross-sectional area three to five times that of the through electrode 8 connected to the signal terminal.

In the present embodiment, to lower the resistance of the power supply and ground terminals, the through electrode 8 connected to the power supply terminal and the ground terminal is designed to have a cross-sectional area measuring 20 µm on each side, which is greater than the cross-sectional area of the signal terminal. So is the non-contact through electrodes 19, to provide an electrical path through these terminals.

The design lowers the line resistance of the power supply and ground terminals conducting large electric current, hence alleviating heating and signal delay.

A specific purpose of the through electrode 8 is as follows. The rightmost signal-routing through electrode 8c in the figure is an electrode for an addressing bus/data bus. The second right power-supply through electrodes 8a in the figure are electrodes for flash memory high voltage. The third right power-supply through electrode 8a in the figure is a logic electrode. The leftmost signal-routing through electrode 8c in the figure is a chip select electrode.

As discussed in the foregoing, in the chip-stack semiconductor device 40 of the present embodiment, multiple (two) semiconductor chips 1 described in embodiment 1 are stacked.

Therefore, the area of the through electrode 8 required to connect over an extended length connect can be increased in accordance with the length. This reduces the resistance of the through electrode 8 and alleviates voltage drop, heat, delay, and loss. Variations in resistance between terminals can also be reduced.

Further, the switching of some of the through electrodes 8 to the non-contact through electrodes 19 which are not connected to the semiconductor chip 1 allows electric current to run from the upper semiconductor chip 1b through to the lower semiconductor chip 1a.

Embodiment 3

Figure 10:
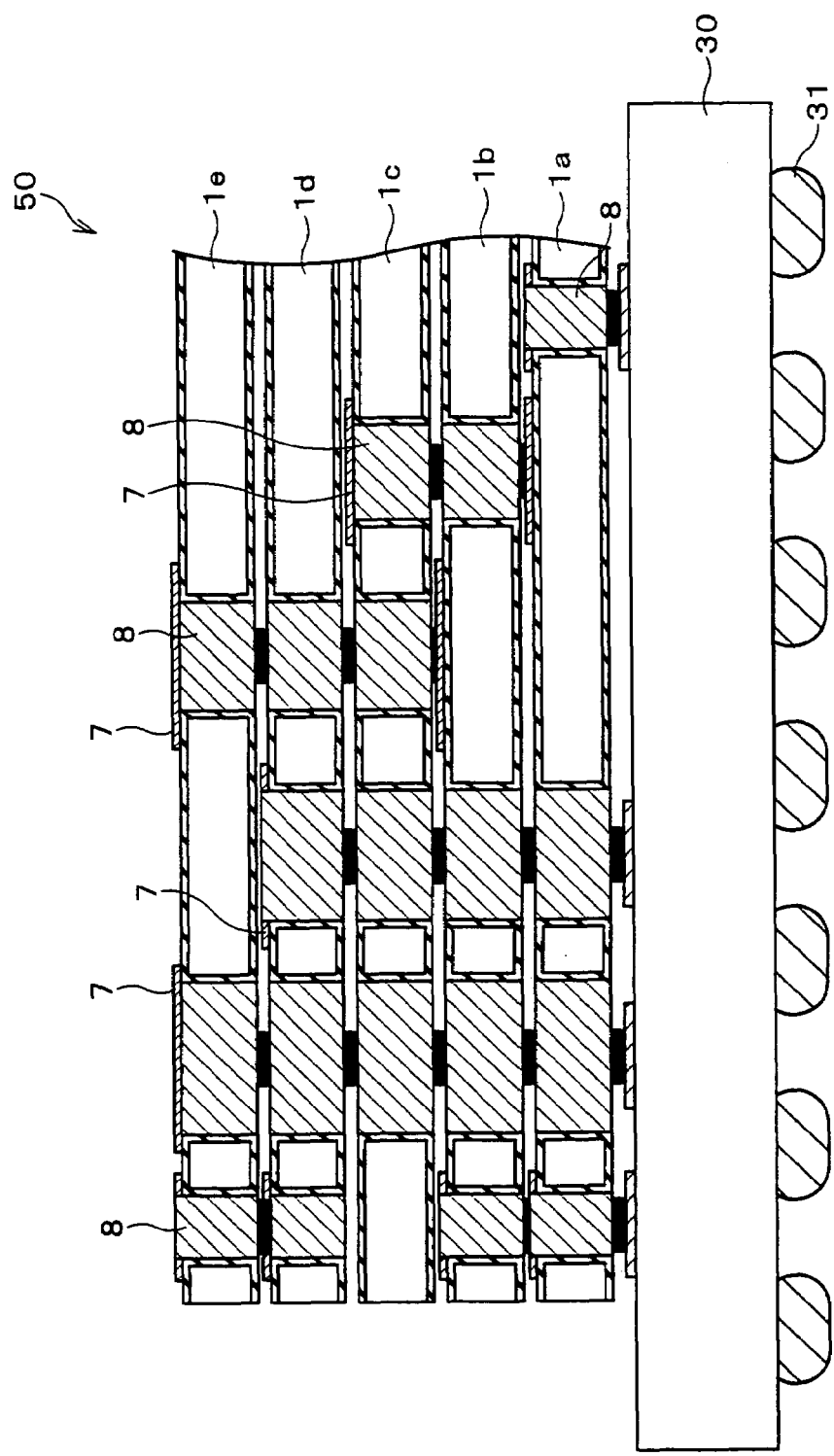
FIG. 10 is a cross-sectional view illustrating another embodiment of a chip-stack semiconductor device in accordance with the present invention.
Figure 11:
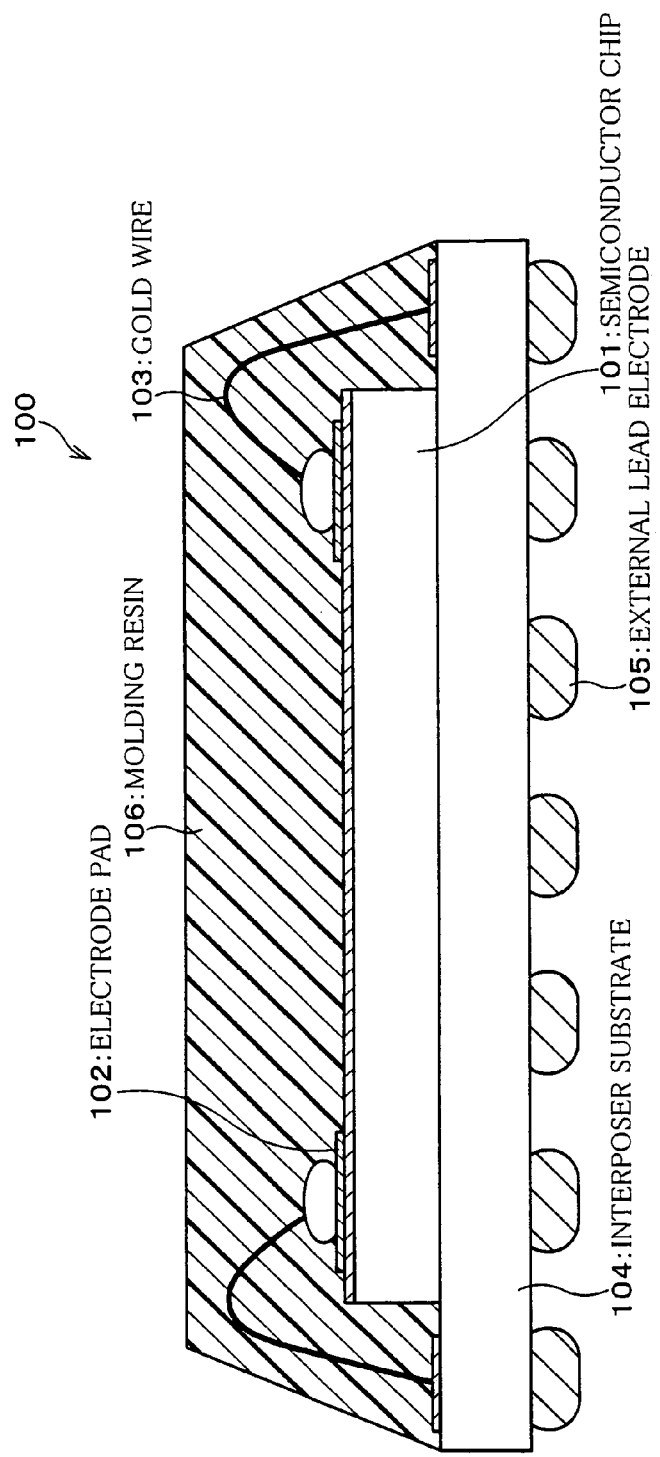
FIG. 11 is a cross-sectional view illustrating a conventional semiconductor device.
Figure 12:
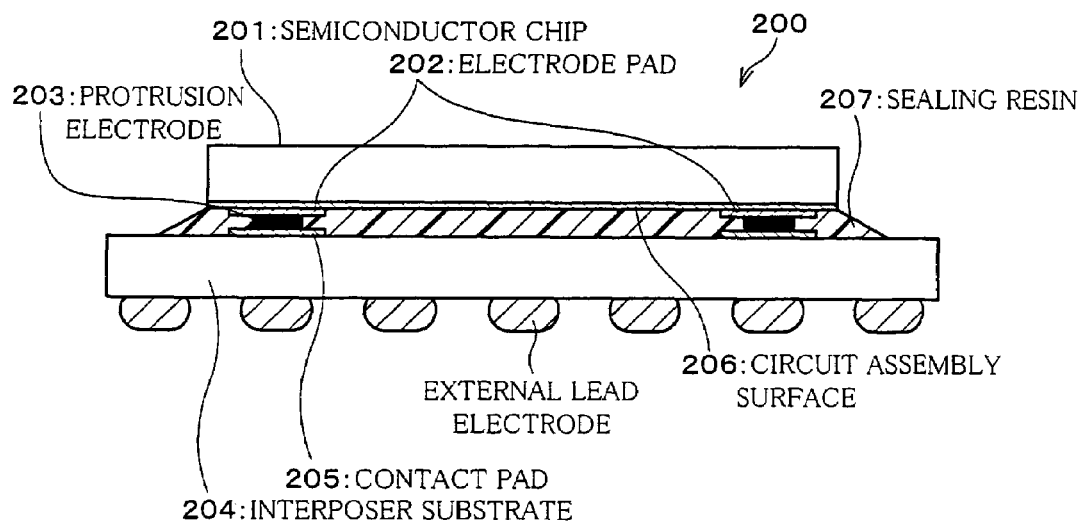
FIGS. 12(*a*), 12(*b*) are cross-sectional views illustrating another conventional semiconductor device.
Figure 12:
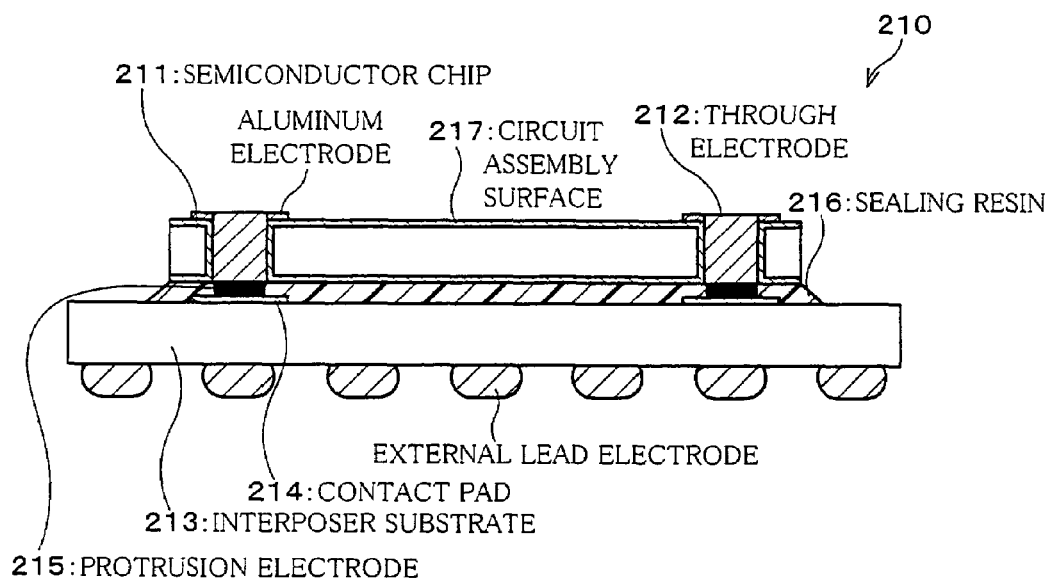
Figure 13:
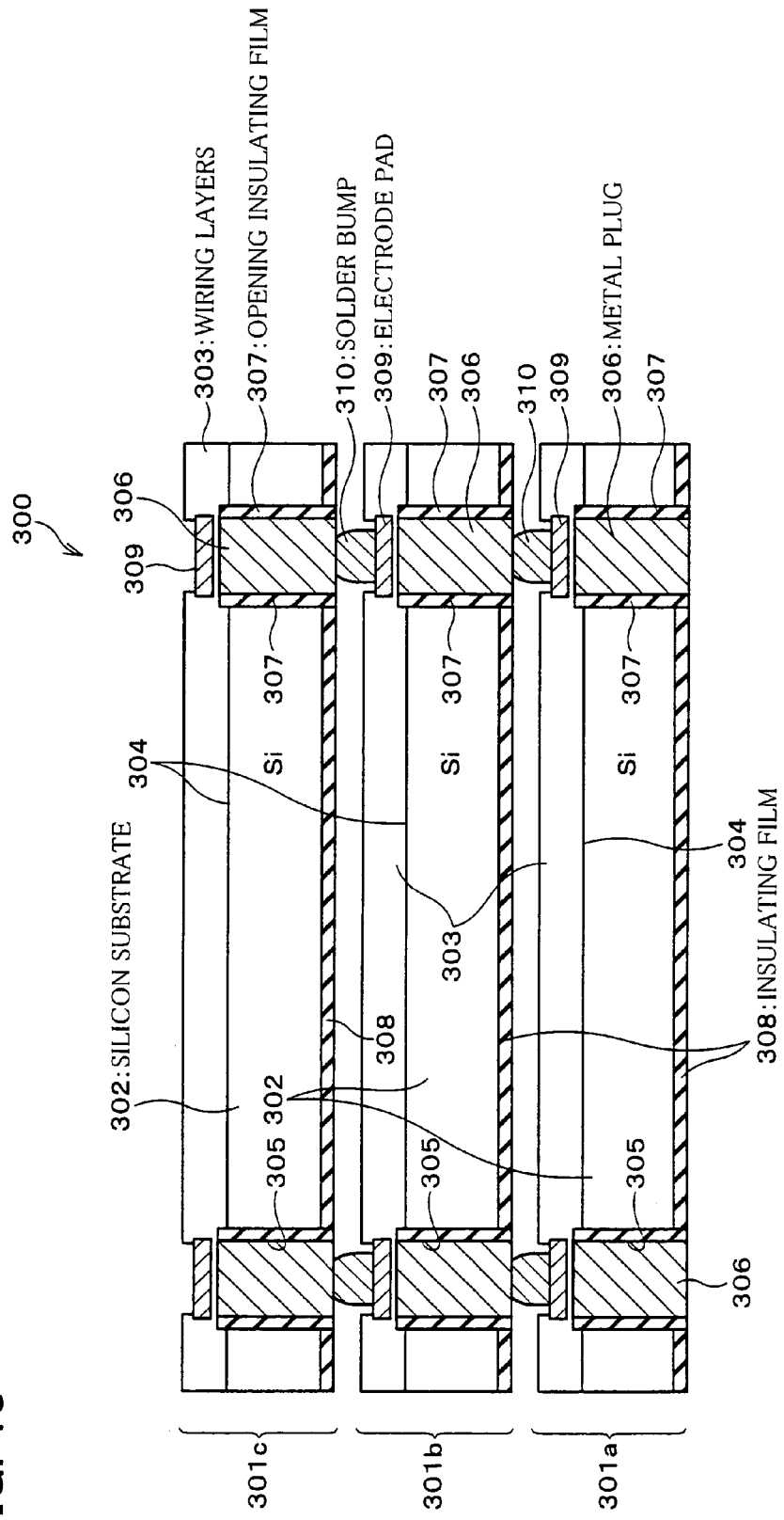
FIG. 13 is a cross-sectional view illustrating a conventional chip-stack semiconductor device.

The following will describe another embodiment of the present invention with reference to FIG. 10. For convenience, members of the present embodiment that have the same arrangement and function as members of embodiments 1, 2, and that are mentioned in that embodiment are indicated by the same reference numerals and description thereof is omitted.

The present embodiment will describe a chip-stack semiconductor device which includes multiple in general and five in particular semiconductor chips 1 of embodiment 1 stacked on top of each other.

Referring to FIG. 10, a chip-stack semiconductor device 50 of the present embodiment includes an interposer substrate 30 on which are sequentially stacked five semiconductor chips 1: a first semiconductor chip 1a, a second semiconductor chip 1b, a third semiconductor chip 1c, a fourth semiconductor chip 1d, and a fifth semiconductor chip 1e.

The figure shows that interconnect lines are longer from the uppermost, fifth semiconductor chip 1e down to the external lead electrodes 31 on the interposer substrate 30 than from the lowermost, first semiconductor chip 1a down to the external lead electrodes 31 on the interposer substrate 30.

In the chip-stack semiconductor device 40 described in embodiment 2 where the vertically adjacent semiconductor chips 1 are connected via the through electrodes 8, all lines measure the same in length, causing no problems. However, for example, when as in the chip-stack semiconductor device 50 of the present embodiment, the electrode pads 7 on the fifth semiconductor chip 1e are connected to the external lead electrodes 31 on the interposer substrate 30 or the fifth semiconductor chip 1e is connected to the through electrodes 8 in the first semiconductor chip 1a, the lines become extended, and their resistance increased, causing signal delay, heating, and other problems. Therefore, in these cases, the line resistance is preferably reduced to a minimum value possible and varies from line to line as little as possible.

Accordingly, in the present embodiment, to eliminate variations of resistance between those through electrodes 8 which connect adjacent semiconductor chips 1 and those which extend through at least one semiconductor chip 1 for connection, the cross-sectional areas of the through electrodes 8 are adjusted. More specifically, the through electrodes 8 are formed to have a large cross-sectional area according to the interconnect line length through the multiple stacked semiconductor chips 1.

To generalize the concept, the through electrode 8 connecting n+1 or more adjacent semiconductor chips 1 (n is an integer more than or equal to 2) is formed to have a greater cross-sectional area than the through electrode 8 connecting n adjacent semiconductor chips 1 (n is an integer more than or equal to 2).

Specifically, in the present embodiment, to stack semiconductor chips 1 of the same thickness, the through electrode 8 connecting two adjacent semiconductor chips 1 is formed with a cross-sectional area twice that of the through electrode 8 when only one semiconductor chip 1 is involved; the through electrode 8 connecting three adjacent semiconductor chips 1 is formed with a cross-sectional area three times that of the through electrode 8 when only one semiconductor chip 1 is involved; the through electrode 8 connecting four adjacent semiconductor chips 1 is formed with a cross-sectional area four times that of the through electrode 8 when only one semiconductor chip 1 is involved; and the through electrode 8 connecting five adjacent semiconductor chips 1 is formed with a cross-sectional area five times that of the through electrode 8 when only one semiconductor chip 1 is involved.

Now referring to FIG. 10 for more specific description, each semiconductor chip 1 is specified to have a thickness of 50 μm. When only the first semiconductor chip 1*a* is connected to the interposer substrate 30, the through electrode 8 (the rightmost one in FIG. 10) is specified to have a cross-sectional area of 100 μm².

To connect adjacent two semiconductor chips, i.e. the second and third semiconductor chips 1*b*, 1*c*, the through electrode 8 (the second right one in FIG. 10) is specified to have a cross-sectional area of 200 μm². To connect adjacent three semiconductor chips, i.e., the third, fourth, and fifth semiconductor chips 1*c*, 1*d*, 1*e*, the through electrode 8 (the third right one in FIG. 10) is specified to have a cross-sectional area of 300 μm².

To connect adjacent four semiconductor chips, i.e., the first, second, third, and fourth semiconductor chips 1*a*, 1*b*, 1*c*, 1*d*, the through electrode 8 (the fourth right one in FIG. 10) is specified to have a cross-sectional area of 400 μm².

To connect adjacent five semiconductor chips, i.e., the first through fifth semiconductor chips 1*a* through 1*e*, the through electrode 8 (the fifth right one in FIG. 10) is specified to have a cross-sectional area of 500 μm².

Therefore, in the present embodiment, the through electrode 8 is specified to have a cross-sectional area which is in proportion to the interconnect line length through the multiple stacked semiconductor chips 1. The resistance values of the through electrodes 8 are thereby made uniform.

When semiconductor chips 1 with various thicknesses are stacked, the proportional relationship between the length and the cross-sectional area of the through electrode 8 alleviates variations in resistance from one terminal to the other, and reduces the resistance value of extended lines.

Further, forming power supply terminals, ground terminals, etc. with a large cross-sectional area alleviates heating, signal delay, etc.

As discussed in the foregoing, in the chip-stack semiconductor device 50 of the present embodiment, the through electrode 8 connecting n+1 or more adjacent semiconductor chips 1 (n is an integer more than or equal to 2) is formed to have a greater cross-sectional area than the through electrode 8 connecting n adjacent semiconductor chips 1 (n is an integer more than or equal to 2).

For this reason, the cross-sectional area of the through electrode 8 can be increased in accordance with the interconnect line length.

Further, in the chip-stack semiconductor device 50 of the present embodiment, the through electrode 8 is formed to have a large cross-sectional area in accordance with the interconnect line length through the multiple stacked semiconductor chips 1. Hence, the chip-stack semiconductor device 50 can be provided which is capable of preventing the resistance of the through electrodes 8 from developing excessive voltage drop, heat, delay, and loss, and also from varying from one electrode to the other.

In addition, in the chip-stack semiconductor device 50 of the present embodiment, the through electrode 8 is specified to have a cross-sectional area which is in proportion to the interconnect line length through the multiple stacked semiconductor chips 1; therefore, the cross-sectional area can be readily determined.

As in the foregoing, a semiconductor device in accordance with the present invention is such that at least one type of the through electrodes is contact through electrodes electrically connected to the semiconductor chip.

According to the invention, as to the contact through electrodes electrically connected to the semiconductor chip, increasing the cross-sectional areas of the through electrodes for the terminals required to conduct large electric current helps efficient operation of the semiconductor chip.

Another semiconductor device in accordance with the present invention is such that in the foregoing semiconductor device, at least one type of the through electrodes is non-contact through electrodes not electrically connected to the semiconductor chip.

According to the invention, as the through electrodes, non-contact through electrodes are provided which are not electrically connected to the semiconductor chip.

Therefore, the heat generated in the semiconductor device can be discharged outside via the non-contact through electrodes.

Another semiconductor device in accordance with the present invention is such that in the foregoing semiconductor device, the cross-sectional areas are increased according to a magnitude of an electric current via the through electrodes.

According to the invention, increasing the cross-sectional areas of the through electrodes for terminals required to conduct large electric current reduces the resistance of the through electrodes and alleviates heating, signal delay, etc. Variations in resistance between terminals can also be reduced.

Another semiconductor device in accordance with the present invention is such that in the foregoing semiconductor device, the cross-sectional areas of those through electrodes which are connected to a ground terminal or a power supply terminal of the semiconductor chip are greater than he cross-sectional areas of those through electrodes which are connected- to a signal terminal.

More specifically, in the semiconductor chip, the ground terminal or the power supply terminal conduct greater electric current than the signal terminal.

As to this point, in the present invention, the through electrodes connected to either the ground terminal or the power supply terminal of the semiconductor chip are formed with greater cross-sectional areas than the through electrodes connected to the signal terminal.

Therefore, increasing the cross-sectional areas of the through electrodes for the ground terminal or the power supply terminal of the semiconductor chip required to conduct large electric current reduces the resistance of the through electrodes and alleviates heating, signal delay, etc. Variations in resistance between terminals can also be reduced.

A chip-stack semiconductor device in accordance with the present invention is such that in the foregoing chip-stack semiconductor device, the cross-sectional areas of those through electrodes which connect n+1 or more adjacent semiconductor chips are greater than the cross-sectional areas of those through electrodes which connect n adjacent semiconductor chips, where n is an integer more than or equal to 2.

According to the invention, the combined cross-sectional area of the through electrodes becomes larger in accordance with the number of stacked, interconnected semiconductor chips.

Therefore, the cross-sectional areas of the through electrodes can be increased in accordance with the interconnect line length. This reduces the resistance of the electrodes and alleviates voltage drop, heat, delay, and loss.

Another chip-stack semiconductor device in accordance with the present invention is such that in the foregoing chip-stack semiconductor device, the cross-sectional areas are increased according to an interconnect line length through the multiple stacked semiconductor chips.

According to the invention, a chip-stack semiconductor device can be offered which is capable of readily preventing the electrodes' resistance from developing excessive voltage drop, heat, delay, and loss, and also from varying from one electrode to the other.

Another chip-stack semiconductor device in accordance with the present invention is such that in the foregoing chip-stack semiconductor device, the cross-sectional areas are increased in proportion to an interconnect line length through the multiple stacked semiconductor chips.

According to the invention, the cross-sectional areas can be readily determined.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A chip-stack semiconductor device, comprising:
   multiple stacked semiconductor chips,
   each of the semiconductor chips including multiple through electrodes therein linking a front surface to a back surface thereof,
   wherein said multiple through electrodes comprise a first through electrode and a second through electrode,
   wherein the first and second through electrodes have mutually differing cross-sectional areas in a common horizontal plane transverse to a through-hole direction; and
   wherein the cross-sectional areas of those through electrodes which connect n+1 or more adjacent semiconductor chips are greater than the cross-sectional areas of those through electrodes which connect n adjacent semiconductor chips, where n is an integer more than or equal to 2.

2. The semiconductor device as set forth in claim 1, wherein the cross-sectional areas are increased according to a magnitude of an electric current via the through electrodes.

3. The semiconductor device as set forth in claim 1, wherein the cross-sectional areas of those through electrodes which are connected to a ground terminal or a power supply terminal of the semiconductor chip are greater than the cross-sectional areas of those through electrodes which are connected to a signal terminal.

4. The chip-stack semiconductor device of claim 1, wherein the first and second through electrodes are of metal and are made of the same metal material.

5. A chip-stack semiconductor device, comprising multiple stacked semiconductor chips,
   each of the semiconductor chips including multiple through electrodes therein linking a front surface to a back surface thereof,
   wherein said multiple through electrodes comprise a first through electrode and a second through electrode,
   wherein:
     the first and second through electrodes have mutually differing cross-sectional areas in a common horizontal plane transverse to a through-hole direction; and
     at least one type of the through electrodes is contact through electrodes electrically connected to that semiconductor chip; and
   wherein the cross-sectional areas of those through electrodes which connect n+1 or more adjacent semiconductor chips are greater than the cross-sectional areas of those through electrodes which connect n adjacent semiconductor chips, where n is an integer more than or equal to 2.

6. The semiconductor device as set forth in claim 5, wherein the cross-sectional areas are increased according to a magnitude of an electric current via the through electrodes.

7. The semiconductor device as set forth in claim 5, wherein the cross-sectional areas of those through electrodes which are connected to a ground terminal or a power supply terminal of the semiconductor chip are greater than the cross-sectional areas of those through electrodes which are connected to a signal terminal.

8. The semiconductor device of claim 5, wherein the first and second through electrodes are of metal and are made of the same metal material.

* * * * *